United States Patent [19]
Engelsberg et al.

[11] Patent Number: 5,800,625
[45] Date of Patent: Sep. 1, 1998

[54] REMOVAL OF MATERIAL BY RADIATION APPLIED AT AN OBLIQUE ANGLE

[75] Inventors: Audrey C. Engelsberg, Milton; Andrew W. Johnson, South Burlington; William P. Parker, Waitsfield, all of Vt.

[73] Assignee: Cauldron Limited Partnership, Bethesda, Md.

[21] Appl. No.: 686,523

[22] Filed: Jul. 26, 1996

[51] Int. Cl.$^6$ .................................................. B08B 3/12
[52] U.S. Cl. ............................................. 134/1; 134/1.2
[58] Field of Search ...................... 216/65, 66, 121.69; 134/1, 1.2

[56] References Cited

U.S. PATENT DOCUMENTS

| | | | |
|---|---|---|---|
| 4,987,286 | 1/1991 | Allen | 219/121.68 |
| 5,023,424 | 6/1991 | Vaught | 219/121.6 |
| 5,024,968 | 6/1991 | Engelsberg . | |
| 5,099,557 | 3/1992 | Engelsberg . | |
| 5,204,517 | 4/1993 | Cates et al. | 250/205 |
| 5,281,798 | 1/1994 | Hamm et al. | 250/205 |
| 5,319,183 | 6/1994 | Hosoya et al. | 219/121.68 |
| 5,531,857 | 7/1996 | Engelsberg . | |
| 5,643,367 | 7/1997 | Viel | 134/1 |
| 5,643,472 | 7/1997 | Engelsberg et al. | 216/65 |
| 5,669,979 | 9/1997 | Elliott et al. | 134/1 |

FOREIGN PATENT DOCUMENTS

| | | |
|---|---|---|
| WO 93/19888 | 7/1993 | WIPO . |
| WO 95/07152 | 3/1995 | WIPO . |
| WO 95/11764 | 5/1995 | WIPO . |
| WO 97/17163 | 5/1997 | WIPO . |

OTHER PUBLICATIONS

Piper, Lawrence G., et al., "Laser Cleaning of Cryogenic Optics", SPIE, vol. 1329, Optical System contamination: Effects, Measurement, Control II (1990), pp. 110–126.

"Damage–free Laser Ablation Removal of Organic Materials", IBM Technical Disclosure Bulletin, vol. 37, No. 10 (1994), p. 453.

Park, Hee K., et al., "A Practical Excimer Laser–Based Cleaning Tool for Removal of Surface Contaminants", *IEEE Transactions on Components, Packaging, and Manufacturing Technology*, Part A, vol. 17, No. 4, pp. 631–643, Dec. 1994.

Hughes Aircraft Company, "Advanced Removal Techniques by Laser Cleaning (ARTLC)", RL–TR–92–225 Final Technical Report, Rome Laboratory, Air force Systems Command, Griffiss Air Force Base, Sep. 1992.

Bergmann, et al., "Laser–Surface Processing of Metals and Ceramics for Industrial Applications," Applied Surface Science 86, 1995, pp. 259–265, 1995.

Tanabe, et al., "Polarization Dependence of Electric Field Intensity Distributions in Photoresist Films," Jpn. J. Appl. Phys. vol. 33, Pt 1, No. 128, 1994.

Padday, "Contact Angle," Padday, J.F., *Handbook of Adhesion*, Polymer Science and Technology Series, DE Packham, ed., Longman Scientific & Technical, Essex, England, 1992, pp. 82–91.

Hotaling, et al., "An Advanced Surface Particle and Molecular Contaminatant Identification, Removal, and Collection System," Hotaling et al., *Particles on Surface*, Mittal, ed., 1995, pp. 111–139.

von Allmen, et al., "Absorption of Laser Light," von Allmen, M., et al., *Laser–Beam Interactions with Materials*, 2nd ed., Springer, 1995, pp. 5–17.

Shen, "Surface Nonlinear Optics," Shen, Y.R., *The Principles of Nonlinear Optics*, Wiley, 1984, pp. 528–540.

*Primary Examiner*—John Goodrow
*Attorney, Agent, or Firm*—Morgan, Lewis & Bockius LLP; C. Scott Talbot; Robert J. Goodell

[57] ABSTRACT

An apparatus and method for removing undesired material from the surface of a substrate provides a flow of inert gas over the undesired material substrate surface while irradiating the undesired material with energetic photons directed at an angle that is oblique to the substrate. The invention enables removal of undesired material without altering the physical properties of the material underlying or adjacent the removed, undesired material. In certain circumstances, the non-perpendicular incidence permits effective removal where normal incidence caused damage to the substrate or poor removal or both.

22 Claims, 6 Drawing Sheets

REMOVAL OF MATERIAL BY RADIATION APPLIED AT AN OBLIQUE ANGLE

BACKGROUND OF THE INVENTION

The following commonly assigned applications and patents are related hereto and their disclosures are incorporated herein by reference: U.S. patent application Ser. No. 08/609,449, filed Mar. 1, 1996 pending; U.S. patent application Ser. No. 08/472,762, filed Jun. 6, 1995 pending; U.S. patent application Ser. No. 08/306,431, filed Sept. 19,1994 now U.S. Pat. No. 5,643,472 (referred to herein as the "'431 application "); U.S. patent application Ser. No. 08/335,258, filed Nov. 9, 1994 pending (referred to herein as the "'258 application"); U.S. patent application Ser. No. 07/865,039 filed Mar. 31, 1992, now U.S. Pat. No. 5,531,857; U.S. patent application Ser. No. 07/611,198, filed Nov. 9, 1990, now U.S. Pat. No. 5,099,557; and U.S. patent application Ser. No. 07/216,903, filed Jul. 8, 1988, now U.S. Pat. No. 5,024,968 (collectively these applications and patents are referred to herein as "Engelsberg's Irradiation Inventions").

This invention relates to removing material from a surface. More particularly, the invention relates to the removal of material from the surface of a substrate by the employment of radiation at an angle of incidence which is oblique to the substrate without altering the physical properties of material to be left on the substrate that is underlying or adjacent to the material to be removed. This technique is useful in circumstances where the application of radiation at an angle normal to the surface of the substrate results in inadequate removal of material or damage to the substrate surface underlying or adjacent to the material to be removed or both.

Effective removal of undesired material from the surface of a substrate is a critical aspect of many important materials processing and product fabrication processes. As described in the '258 application, undesired materials (which may also be considered as contaminants) include particles, unwanted chemical elements or compounds, and films or layers of material. Particles may be discrete pieces of matter ranging in size from submicrons to granules visible to the unaided eye. Undesired chemicals include any species, element or compound which, at the time at which the removal process is performed, is undesirable. For example, hydroxyl groups (—OH) may be a desired reaction promoter on the surface of a substrate at one stage of a process and may be an undesired contaminant at another stage. Films or layers of material may be organic, such as human body oil from fingerprints, paint, and epoxy, or inorganic, such as oxides of the substrate material or other inorganic materials to which the substrate has been exposed.

Such undesired materials may need to be removed to render the substrate more useful for its intended purpose. For example, in certain precise scientific measurement devices, accuracy is lost when optical lenses or mirrors in the devices become coated with microfine surface contaminants. Similarly in semiconductors, surface defects due to minor molecular contaminants often render photomasks or chips worthless. Reducing the number of molecular surface defects in a quartz photomask by even a small amount can radically improve semiconductor chip production yields. Similarly, removing molecular surface contaminants, such as carbon or oxygen, from the surface of silicon wafers before circuit layers are deposited on the wafer or between deposition of layers significantly improves the quality of the computer chip produced.

Selective removal of layers of the substrate material may be done to form very small-scale structures on the substrate surface (so-called "nanostructures"). Material (whether substrate material, oxide layers, or other layers of material) may also be selectively removed in differing amounts across the surface of the substrate to change the surface topography of the substrate (such as smoothing a rough surface).

Material processing equipment often requires treatment for removal of undesired material to prevent contamination of products processed by the equipment. For example, a significant portion of the undesired material that ultimately contaminates silicon wafers during production emanates from production apparatus such as process chambers in which the wafers are placed, quartz wafer boats used to hold wafers for passage through quartz furnace tubes (and the furnace tubes themselves), and pipes that conduct processing gas to the chambers. Accordingly, the level of wafer contamination experienced during the course of production can be significantly reduced by the periodic cleaning of such apparatus.

In general, any process used for removing material from a substrate should do so without affecting the physical properties of the (desired) material that remains. The physical properties that should remain unaffected can in general include crystalline structure, conductivity, density, dielectric constant, charge density, Hall coefficient, and diffusion coefficient for electrons/holes. In particular semiconductor applications (such as metal oxide semiconductor ("MOS"); field effect transistor ("FET"); and bipolar junction ("BJT")), the properties can include capacitance/area in MOS; junction capacitance; channel current in an FET, directed from drain to source; voltage from collector to base, emitter to base in a BJT; voltage from drain to source, gate to source in an FET; MOS threshold potential; MOS surface state charge/area; and storage delay time. Further, it may be undesirable to change the topography (such as the surface roughness) of the remaining material.

As described in detail in the '258 and '431 applications, many techniques have been proposed (and are currently used) for removing undesired materials. These include wet chemical cleaning (RCA process), dilute HF, megasonic and ultrasonic, and supercritical fluid cleaning, UV and ozone cleaning, brush cleaning, vapor HF, laser-assisted liquid cleaning (including the Allen process and Tam process), surface melt, annealing, ablation, plasma cleaning and dry ice ($CO_2$) cleaning.

All of these techniques suffer from some drawbacks, including: inability to remove very small particles; undesirable alteration of the underlying substrate's physical properties; consumption of large quantities of expensive materials such as ultrapure water and gases; and production of toxic waste products (such as HF acids). Engelsberg's Irradiation Inventions solve the problems and avoid the drawbacks of these prior art techniques by removing undesired material from a treatment surface of a substrate by irradiating the undesired material with energetic photons having a spatial and temporal concentration (energy and power fluxes) sufficient to remove the undesired material and insufficient to alter the physical properties of the underlying substrate. However, under certain circumstances, Engelsberg's Irradiation Inventions are ineffective at removing undesired material or cause damage to the materials to be left on the substrate that is underlying or adjacent to the material to be removed.

SUMMARY OF THE INVENTION

The invention solves the problems and avoids the drawbacks of the prior art and Engelsberg's Irradiation Inventions by removing undesired material from a treatment surface of a substrate by irradiating the undesired material at an angle of incidence that is non-normal with respect to the substrate surface with energetic photons having a spatial and temporal concentration (energy and power fluxes) sufficient to remove the undesired material and insufficient to alter the physical properties of the underlying substrate. Preferably, a gas is flowed continuously across the surface to carry away removed material to avoid redepositing the material elsewhere on the treatment substrate. Optimally, the gas is inert to the substrate and to the material to be removed. Moreover, to best avoid the possibility of contaminants entrained in the flow being deposited on the treatment surface, the flow of gas is preferably in the laminar flow regime.

The radiation source (of energetic photons) may be any means known in the art to provide photons of the requisite energy level, including pulsed or continuous wave lasers and high-energy lamps. In some applications, such as those in which the bonds of interest require the near-simultaneous application of multiple photons, a source with a high power output is preferred, such as a pulsed ultraviolet laser.

The invention is shown to be applicable to the removal of chemical mechanical polishing ("CMP") slurry residue from patterned silicon wafers. At normal incidence the slurry residue was removed from the wafers yet the aluminum circuit patterns were damaged. Surprisingly, at an oblique angle and at reduced energy and power fluxes the slurry was removed and no damage resulted.

The invention is also shown to be applicable to the removal of silicon nitride particles from bare silicon. Here, there was poor removal at normal incidence and effective, non-damaging removal when radiation was directed to the substrate at an oblique angle.

The invention is further shown to be applicable to the removal of polyurethane foam from vinyl. Given similar energy levels, at normal incidence the material was damaged and removal was poor yet at oblique angles the foam was removed without damage.

Moreover, the invention is shown to be applicable to the removal of photoresist particles from a thin film of chrome on a quartz photomask. At an oblique angle particles were removed without damage. In contrast, at normal incidence particle removal was poor and the chrome peeled away from the quartz photomask.

DETAILED DESCRIPTION

Reference will now be made in detail to presently preferred embodiments of the invention, examples of which are illustrated in the accompanying drawings. Throughout the drawings, like reference characters are used to designate like elements.

1. Basic Treatment Method and Apparatus

Figure 1:
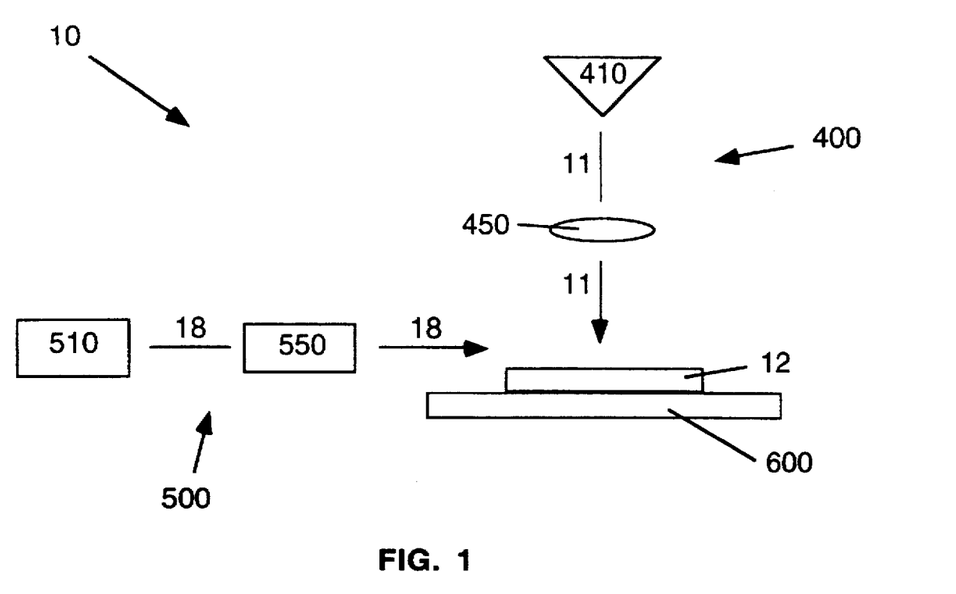
FIG. 1 is a schematic diagram of a method and apparatus for removing undesired material from a substrate according to the principles of Engelsberg's Irradiation Inventions.

A method and apparatus for removing undesired material from a treatment surface of a substrate without altering the physical properties of the substrate is illustrated schematically in FIG. 1. As shown in FIG. 1, apparatus 10 for treating a substrate 12 from which undesired material is to be removed includes a radiation system 400, a gas system 500, and a relative motion system 600. Irradiation system 400 includes a source 410 of radiation 11 (which consists of energetic photons), such as a laser and suitable delivery optics 450 that conduct radiation 11 to the treatment surface of substrate 12. Gas system 500 includes a source 510 of a gas 18 and an associated delivery system 550 for flowing gas 18 over at least the portion of the surface of substrate 12 to which radiation 11 is applied. Gas 18 is preferably inert to substrate 12 and is flowed across substrate 12 so as to bathe substrate 12 in a non-reactive gas environment. Preferably, gas 18 is a chemically inert gas such as helium, nitrogen, or argon and is delivered in the laminar flow regime. Relative motion system 600 provides for relative motion between a portion of the treatment surface of substrate 12 to be treated and radiation 11 and, optionally, gas 18.

Each of the constituent elements of these components of apparatus 10 (radiation source 410, delivery optics 450, gas source 510, gas delivery system 550, and relative motion system 600) may be such as are described in the '258 application and are readily selectable by the artisan to configure the apparatus in accordance with the principles of the invention. For example, delivery optics 450 may include mirrors, lenses, optical fibers, collimators, apertures, beam homogenizers, and other elements. Gas delivery system 550 may include conduits, chambers, lines, valves, filters, flow meters, and other elements. Relative motion system 600 may be any suitable system for translational or rotational movement of substrate 12 with respect to radiation 11 and gas 18, and may include a translational stage for planar translation of the substrate, a rotational fixture for rotating the substrate, or movable components in the delivery optics to scan radiation beam 11 across the substrate. Illustrative embodiments of apparatus 10 are described in more detail below.

According to the method of the invention, energetic photons are irradiated upon the substrate treatment surface in a spatial and temporal concentration (energy and power fluxes) sufficient to remove undesired material from the substrate treatment surface and insufficient to alter the physical properties of material that is desired to be left on the substrate surface.

To remove the undesired material, the bonds by which it is adhered to the underlying and adjacent material on the treatment surface (which may be more of the same material, the substrate material, or a third material) must be broken. Each such bond is broken by introducing an amount of energy at least equal to the energy of formation of the bond. Bond formation energies (i.e., the amount of energy released when the bond is formed) for common substrate materials are shown in Table 1a, below. The bond energies shown are between the material elements themselves (e.g., Cr—Cr) and between the material element and oxygen (e.g., Cr—O). Bond formation energies for various carbon compounds are shown in Table 1b, below.

TABLE 1a

| Element | Bond Formation Energy (eV/bond) | |
|---|---|---|
| | Self | Oxygen (—O) |
| O | | 5.2 |
| Cr | 1.6 | 4.5 |
| Si | 3.4 | 8.3 |
| Mo | 4.2 | 5.8 |
| Fe | 1.0 | 4.1 |
| Ni | 2.1 | 4.0 |
| Er | | 6.4 |
| Zr | | 8.1 |
| Ta | | 8.3 |
| W | | 7.0 |

TABLE 1b

| Element | Bond Formation Energy (eV/bond) |
|---|---|
| C | 6.3 |
| Cl | 4.1 |
| F | 5.7 |

TABLE 1b-continued

| Element | Bond Formation Energy (eV/bond) |
|---|---|
| H | 3.5 |
| Mo | 5.0 |
| O | 11.2 |
| Si | 4.7 |
| Zr | 5.8 |

The bonds are broken when energy carried by photons is imparted to the bonds in an amount greater than the bond formation energy. It is believed that there are energy inefficiencies inherent in this bond-breaking process and, therefore, that the amount of photon energy required is approximately twice the bond formation energy. As can be seen in Tables 1a and 1b, oxide bond energies are on the order of 4.0 to 8.3 eV, while organic (carbon) bond energies are on the order of 3.5 to 11.2 eV. Thus, photon energies of approximately 7 to 22 eV are required.

The energy of a photon depends on its wavelength, in the relationship:

$$E = \frac{hc}{\lambda}$$ Equation 1 where c is the speed of light ($3.00 \times 10^8$ m/s), $\lambda$ is wavelength (m), and h is Planck's constant ($4.14 \times 10^{-15}$ eV sec). Selection of the source of photons therefore depends on the photon energy required, and thus on the wavelength required. A variety of lasers is identified in Table 1c, below. The table identifies the laser medium (and whether the medium is gas (g), liquid (l), solid (s), or plasma (p)), the photon wavelength $\lambda$ (nm), and the photon energy $E_{ph}$ (eV). For continuous wave lasers, an average power $P_{ave}$ (W) is also shown, and for pulsed lasers, the energy per pulse $E_{pulse}$ (J), a representative pulse duration $t_{pulse}$ (ns) and the peak power during a pulse $P_{peak}$ (MW).

TABLE 1c

| Medium | λ (nm) | Eph (eV) | Epulse (J) | tpulse (ns) | Pave (W) | Ppeak (MW) |
|---|---|---|---|---|---|---|
| C (6+) (p) | 18 | 68.242 | 2.00E−03 | 50 | | 4.00E−02 |
| ArF excimer (g) | 193 | 6.435 | 5.00E−01 | 50 | | 1.00E+01 |
| KrF excimer (g) | 248 | 5.008 | 5.00E−01 | 34 | | 1.47E+01 |
| He—Cd (g) | 442 | 2.810 | | | 1.00E−02 | |
| Ar+ (g) | 515 | 2.412 | | | 1.00E+01 | |
| Rhodamine-6G dye (l) | 560 | 2.218 | | | 1.00E−01 | |
| | 640 | 1.941 | | | 1.00E−01 | |
| He—Ne (g) | 633 | 1.962 | | | 1.00E−03 | |
| Kr+ (g) | 647 | 1.920 | | | 5.00E−01 | |
| Ruby (s) | 693 | 1.792 | 5.00E+00 | 50 | | 1.00E+02 |
| Ti(3+):Al2O3 (s) | 660 | 1.882 | | | 1.00E+01 | |
| | 1180 | 1.053 | | | | |
| Nd(3+):glass (s) | 1060 | 1.172 | 5.00E+01 | 50 | | 1.00E+03 |
| Nd(3+):YAG (s) | 1064 | 1.167 | | | 1.00E+01 | |
| KF Color Center (s) | 1250 | 0.994 | | | 5.00E−01 | |
| | 1450 | 0.857 | | | 5.00E−01 | |
| He—Ne (g) | 3390 | 0.366 | | | 1.00E−03 | |
| FEL (LANL) | 9000 | 0.138 | 1.00E−03 | 50 | | 2.00E−02 |
| | 40000 | 0.031 | 1.00E−03 | 50 | | 2.00E−02 |
| CO2(g) | 10600 | 0.117 | | | 1.00E+02 | |
| H2O(g) | 118700 | 0.010 | | | 1.00E−05 | |
| HCN(g) | 336800 | 0.004 | | | 1.00E−03 | |

Comparing the photon energies for the above lasers to the required energies identified above for common substrate materials (and accounting for the expected inefficiencies), it is apparent that in most cases the energy of a single photon will not be sufficient to break the bonds of interest. However, it is believed that the bond-breaking energy can be supplied by multiple photons if the photons strike the bond within a very short time, or essentially "simultaneously."

Since a certain amount of energy is required to break each bond, the total amount of energy (and thus, the total number of photons of a given energy) required to remove a given amount of undesired material from the treatment surface of a substrate is generally proportional to the number of bonds in that amount of material. It is believed that photons interact with bonds only in the interfacial region of the treatment surface (i.e., the topmost one or two layers of atoms or molecules (monolayers)). For removal of substantially continuous layers of material (such as oxide layers) it is therefore helpful to consider unit surface areas and thicknesses of material in monolayers. Thus, for a given surface area, the removal of a certain thickness (or number of monolayers) of material requires the effective application of a given amount of energy (number of photons). Of course, not all of the photons that strike a substrate treatment surface will contribute to bond breaking—it is believed that a small fraction of the photons contribute to bond breaking. This is believed to be at least in part because the effective locations (the bonds, or parts thereof) for absorption of the photon energy occupy a small fraction of the surface area. However, at least for a given material, it is believed that there is a relatively constant relationship between the actual number of photons required and the theoretical number based on the number of bonds to be broken. Accordingly, a relevant parameter to consider is the energy flux (energy per unit area, or number of photons per unit area) applied to a substrate treatment surface, which corresponds to a thickness of undesired material removed.

As noted above, there are cases in which the bonds of interest require more energy than is carried by a single photon emitted by the selected radiation source. Such bonds are referred to herein as a "multi-photon bonds." As noted above, the energies of two or more photons are believed to be additive to supply the energy required to break a multi-photon bond only if the photons strike the bond simultaneously. This implicates the arrival rate of photons at a bond site, which is a power flux (energy per unit time per unit area). Further, it is believed that there is a probabilistic nature to multi-photon bond breaking. For a given average power flux over an area of the substrate, there is an average arrival rate of photons at any given bond site. However, the actual arrival rate of photons should be randomly distributed about the average value. Thus, if there is a minimum photon arrival rate (maximum time interval between the photons) at which photon energy addition will take place to allow breaking of a multi-photon bond, an average power flux applied to a given area that corresponds to that minimum arrival rate will expose approximately half of the bond sites in that area exposed to the requisite arrival rate (or a greater rate). Conversely, even if the average power flux is somewhat lower than that required to produce the minimum required photon arrival rate, it is expected that photons will arrive at some of the bond sites within the required interval.

In summary, to remove a given thickness of undesired material from a substrate treatment surface, a minimum total energy flux (a total number of photons of a given energy level per unit area) must be applied to the undesired material. If multi-photon bonds are involved, a certain power flux is also required, and the higher the power flux, the greater the chance that each bond site will be subjected to the requisite photon arrival rate. The selection of a suitable source of energetic photons thus requires an evaluation of the required photon energy and, for multi-photon bonds, the available power. As will become apparent from the data presented below, to remove CMP residue and particles, preferred photon sources are therefore pulsed UV lasers, which have the highest peak power levels and high photon energies.

A competing consideration limits the energy and power fluxes that may be applied to a substrate treatment surface—the need to avoid altering the physical properties of the material that is to be left on the surface. In general, changes in the physical properties of a material are caused by increasing the temperature of the material above a threshold level. The change in temperature of the surface of a material caused by the application of radiant energy depends on the heat transfer characteristics of the material and the power and energy fluxes of the applied radiation. Finding the maximum power and energy fluxes usable on a given substrate material will require some experimentation. Prior art laser cleaning techniques that rely on vaporization, ablation, or surface melting provide some guidance in the energy and power fluxes required to produce surface changes in substrate materials.

In Engelsberg's Irradiation Inventions, the photons were preferably directed perpendicular to the plane of the portion of the substrate being treated, to maximize the power and energy fluxes at the surface for a given output from the source of photons. It was believed that the only effect of directing photons at an oblique angle was that the energy and power fluxes at the surface would be reduced by a factor corresponding to the sine of the angle of incidence with respect to the plane of the surface. However the invention demonstrates that there are situations where the removal of undesired materials is improved at an oblique angle despite the reduced energy and power fluxes, these reduced fluxes resulting in a lesser probability of damage.

2. Test Apparatus

Figure 2:
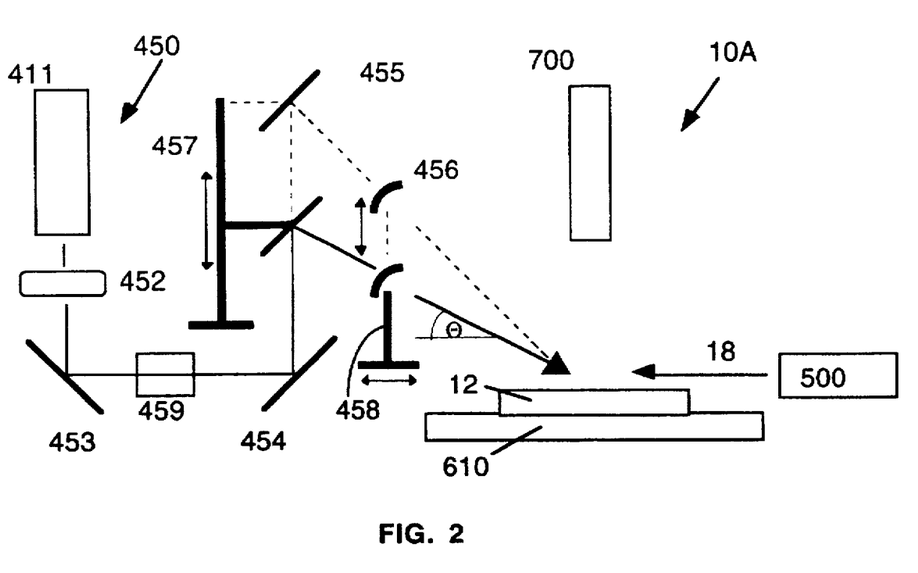
FIG. 2 is a schematic diagram of the method and apparatus of the invention for removing undesired material from a substrate according to the principles of the invention.

The test apparatus is illustrated schematically in FIG. 2. In this apparatus (identified in the figure as 10A), the radiation source is laser 411, which is a pulsed KrF excimer laser, sold by Lambda Physik as model number LEXtra 200. This laser has a wavelength of 248 nm (for a photon energy of 5.01 eV), a maximum output energy per pulse of 600 mJ, and a fixed pulse duration of 34 ns (for a maximum power per pulse of 17.65 MW). The maximum pulse repetition rate is 30 Hz, producing a maximum average power of 18 W. The radiation beam is 23 mm by 13 mm at the laser output.

Radiation delivery system 450 includes, in the order encountered by radiation beam 11 upon leaving laser 411, an aperture plate 452, turning mirrors 453, 454, and 455, and cylindrical lens 456. Aperture plate 452 can be used to block the "tails" of the Gaussian distribution of photons emanating from laser 411, so that the spatial distribution of energy in radiation beam 11 is approximately uniform across a plane perpendicular to the beam. The method used to determine the appropriate aperture dimensions is to allow several laser shots to sufficiently impinge the beam image on facsimile paper. Measurements of the length and width of the beam image are made with a metric dial caliper. Turning mirrors 453–455 are planar mirrors. Mirror 455 can be raised or lowered on mirror support 457 and rotated to adjust the angle of incidence (AI), Θ, of the beam to the surface of the substrate. The smallest incident angle employed in the examples was 6° and the largest was 83.9°—at greater angles the radiation beam would be reflected back through the radiation delivery system 450. Therefore, normal incidence as discussed in the examples refers to incident angles of approximately 84° relative to the horizontal plane of the treatment surface. Cylindrical lens 456 is a 2"×2" lens having a 200 mm focal length and is sold by Acton Research in Acton, Massachusetts. Cylindrical lens 456 can be raised or lowered on lens support 458 to intercept the beam 11 and moved closer or farther from the substrate to adjust the focus of the beam. The cylindrical lens 456 may be adjusted so that the focal plane of the radiation beam 11 is located above (referred to herein as "before focus") or below (referred to herein as "through focus") the plane of the portion of the substrate being treated. (The effects of before and through focus are discussed in greater detail in section 4.) Mirror 455 and cylindrical lens 456 are held in 5-axis 100 mm gimbal mounts and are adjusted through the use of a micrometer stage. The beam width on the surface of the substrate is also adjusted using the micrometer stage. Optionally, element 459 may be added. It may be a polarizer, beamsplitter, or attenuator. All optical elements are anti-reflection coated for 248 nm light. This apparatus can be motorized and automated for computer control.

Figure 3:
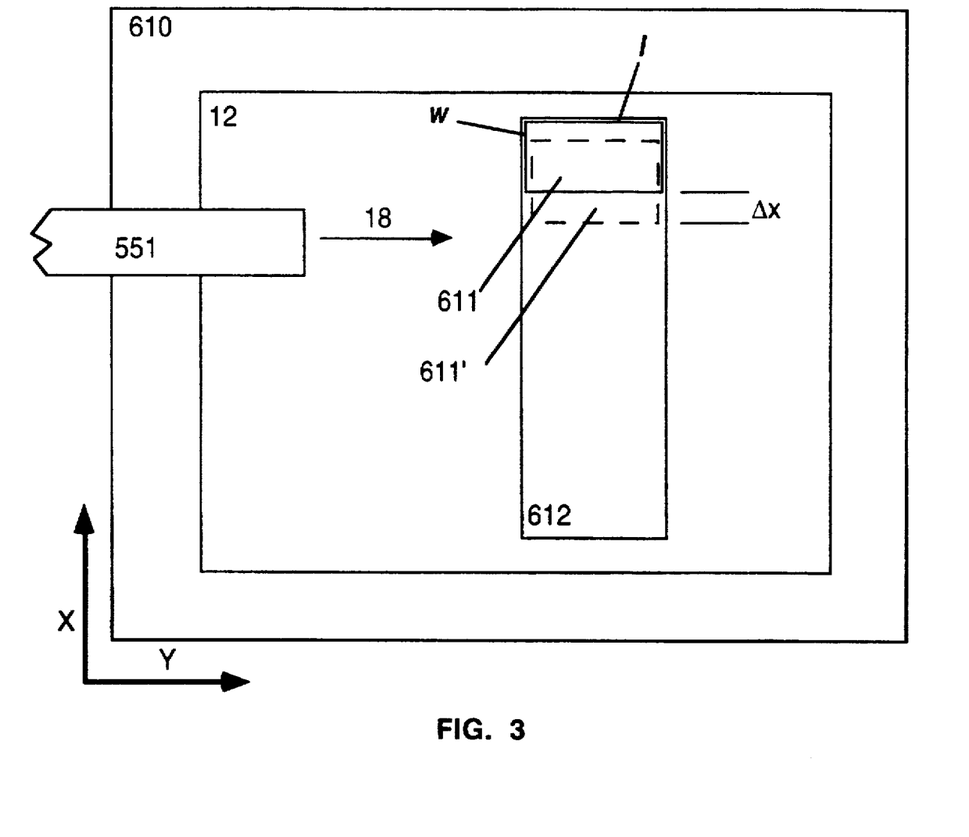
FIG. 3 is a schematic diagram of the geometry of the incident radiation region produced on a substrate by either of the apparatus of FIGS. 1–2.

Radiation beam 11 is delivered in a direction toward stage 610 on which substrate 12 is mounted. As shown in FIG. 3, stage 610 can be translated in the X and Y directions (parallel to the plane of the stage, and indicated in FIG. 3 by arrows X and Y). Radiation beam 11 produces a generally rectangular incident radiation region 611 with a width w and a length I. Region 611 is swept across the surface of substrate 12 by translating stage 610.

Gas delivery system 500 includes a dewar of liquid nitrogen (4500 I capacity) coupled in series to: a dual stage regulator; a moisture/oxygen adsorber (MG Industries Oxisorb, which adsorbs to concentrations of 0.01 ppb); a Millipore Model 304 particle filter (filters to 0.003 µm); a flow meter connected to a Cole-Parmer stainless steel mass flow controller, part number H-32561-42 calibrated for nitrogen and inert gas service; a second Millipore Model 304 particle filter (filters to 0.003 µm); and thence to a nozzle 551 terminating adjacent region 611. Nozzle 551 discharges a flow of gas 18 across region 611, and remains fixed with respect to region 611 so that stage 610 and substrate 12 translate with respect to it. This gas delivery system is useful for materials that are not sensitive to typical atmospheric gases, and permits a simpler apparatus than is required when it is required or desired to isolate the substrate from the atmosphere during treatment (such as disclosed in the '258 application).

A video camera 700 is positioned to view region 611 and thus provide visual data on the results of treatment.

In the illustrated embodiment, stage 610 is first translated longitudinally in the X direction as radiation beam 11 is applied to the surface of substrate 12, producing an elongated rectangular swath 612 on substrate 12 that has been exposed to radiation beam 12. Stage 610 may be indexed back to a starting position and translated in the X direction again so that radiation beam 12 makes another "pass" over swath 612. After one or more passes, stage 610 may be translated laterally in the Y direction a distance approximately equal to length I, then translated again through the X direction to form another swath adjacent to the previous swath 612. Thus, the portion of the surface of substrate 12 to be treated is sequentially exposed to radiation beam 11 and the concurrent flow of gas 18.

The energy flux (energy per unit area) applied to any point on the surface of substrate 12 by radiation beam 11 during a single pulse of laser 411 is equal to the energy of the pulse at the surface divided by the area over which that energy is distributed. This can be expressed as:

$$F_{eps} = \frac{E_{ps}}{I \cdot W} \qquad \text{Equation 2}$$

where $F_{eps}$ is the pulse energy flux per unit area at the surface (J/cm²), $E_{ps}$ is the pulse energy at the surface (J), and I and w are the length and width of region 611 (mm). Similarly, a pulse power flux ($F_{pps}$) can be calculated as:

$$F_{pps} = \frac{F_{eps}}{t_p} \qquad \text{Equation 3}$$

where $t_p$ is the laser pulse duration.

There are energy losses associated with the passage of radiation beam 11 through the optics and aperture plate. Thus, the laser pulse energy at the surface ($E_{ps}$) is less than the emitted laser pulse energy. The LEXtra 200 laser includes a mini-controller with a pulse energy meter that is useful for recording the laser energy output during experiments. However, the internal meter is not extremely accurate. To provide more accurate energy measurements, the test apparatus was calibrated to develop a correction factor to be applied to the internal meter reading to produce a more accurate reading. Accordingly, the laser pulse energy at the surface ($E_{ps}$) was measured with a Molectron J50 detector head and JD 1000 joulemeter disposed at the location of the treatment surface, and the measured energy reading compared to the internal meter reading of pulse energy ($E_{pm}$). A correction factor ($R_{correction}$) was thus developed that included both the losses through the optical train and the meter inaccuracies.

$$E_{ps} = E_{pm} \cdot R_{correction} \qquad \text{Equation 4}$$

This correction factor is not constant—it has been found to vary approximately linearly with the output level of the laser. The pulse energy is dependent on the voltage input ($V_l$) to the laser, which can be adjusted to levels between approximately 17 and 22 kV. The laser output energy (as indicated by the internal meter) varies for a given voltage setting, depending on such factors as the laser gas supply level, so that the voltage cannot be used directly as a measure of pulse energy, but instead the internal meter is read. For convenience, the correction factor is calculated as a function of the voltage setting, then applied to the energy read from the internal meter. The correction factor is of the form:

$$R_{correction} = \frac{1}{m \cdot V_l + b} \qquad \text{Equation 5}$$

where m is the slope, and b is the intercept, of the linear relationship.

Thus, the energy per pulse at the treatment surface is:

$$E_{ps} = \frac{E_{pm}}{m \cdot V_l + b} \qquad \text{Equation 6}$$

In the illustrated embodiment, a swath 612 is formed from a series of discrete regions 611 (as indicated in FIG. 3 by a second region 611' shown in phantom). The distance by which region 611' is offset from region 611 ($\Delta X$) is the product of the time between laser pulses (which is the inverse of the laser pulse repetition rate $R_l$) and the velocity of translation of stage 610 (the scan velocity $v_s$). The energy flux delivered to a given point on the substrate is thus the product of the energy flux per pulse ($F_{eps}$) and the number of laser pulses to which the point is exposed ($N_{pt}$). The number of pulses $N_{pt}$ is equal to the width w of region 611 divided by the distance $\Delta X$ that the stage moves between pulses. Of course, if w is not an integral multiple of $\Delta X$, and each point must receive an integer number of pulses, not every point will receive the same number of pulses. However, the relationship outlined above is reasonably accurate to determine the average energy applied over each swath 612. Further, beginning an indexing the stage laterally before beginning another swath 612, the stage can be left in the same lateral position, and another swath 612 applied in the same place, thus making another "pass" over the substrate. The total energy flux delivered ($F_{et}$) is thus equal to the energy flux per pass ($F_{epa}$) times the number of passes ($N_{pa}$).

The average energy flux applied to the surface of substrate 12 can thus be calculated as:

$$F_{epa} = \frac{F_{eps} \cdot R_l \cdot W}{V_S}$$ Equation 7

The total energy flux applied to a given point is obtained by multiplying the energy flux per pass ($F_{epa}$) by the number of passes:

$$F_{et} = F_{epa} \cdot n_{pa}$$ Equation 8

In the experimental data presented below, the test parameters are identified as shown in Table 2b, below.

TABLE 2b

| Parameter | Description | Units |
|---|---|---|
| $E_{pm}$ | Pulse energy (meter) | mJ |
| $E_{ps}$ | Pulse energy (actual at surface) | mJ |
| $F_{eps}$ | Energy flux per pulse (at surface) | J/cm² |
| $F_{pps}$ | Power flux per pulse (at surface) | MW/cm² |
| $F_{epa}$ | Average energy flux per pass | J/cm² |
| $F_{et}$ | Total energy flux (over total number of passes) | J/cm² |
| l | Length of region 611 | mm |
| $N_{pl}$ | Effective number of pulses striking a point | — |
| $N_{pa}$ | Number of passes | — |
| $R_g$ | Gas supply rate | ml/s |
| $R_l$ | Laser repetition rate | s⁻¹ |
| $v_s$ | Laser scan velocity | mm/s |
| $V_l$ | Laser voltage | kV |
| w | Width of region 611 | mm |
| AI | Angle of incidence of radiation | ° |

3. Examples of Removal of Material Using Various Angles of Incidence

The application of the basic treatment method and apparatus described above with regard to undesired materials is illustrated in the following examples. In each example, a series of treatment "runs" was made on one or more samples of substrate material. Each run consisted of treating a single swath 612 across the treatment surface, with one or more passes on the swath. Unless otherwise noted, the samples were treated on a planar surface.

In these tests, the objective was to remove all of the undesired materials in as few passes as possible (preferably in a single pass) and at the highest stage velocity possible, without damaging the treatment surface. This corresponds to a maximum processing rate for commercial application—treating a substrate in the least possible time. As discussed above, it is believed that the key process factors are the energy flux per pulse ($F_{eps}$), the directly related (by the fixed pulse duration of 34 ns) power flux per pulse ($F_{pps}$), and the total energy flux ($F_{et}$). These process factors were varied by adjusting the pulse energy ($E_{ps}$), laser pulse repetition rate ($R_l$), stage velocity ($V_s$), and incident region width (w). In addition, the angle of incidence (AI) of the radiation to the treatment surface was varied.

a. Chemical Mechanical Polishing (CMP) Slurry Residue

In this example, chemical mechanical polishing (CMP) slurry residue was removed from a patterned silicon wafer. CMP is used in the semiconductor industry to planarize surfaces on microprocessor and memory parts and is one of the most difficult contaminants to remove from a silicon wafer surface. Current industry practice uses double sided brush cleaners, water, bases, and surfactants alone and in various combinations.

Figure 4A:
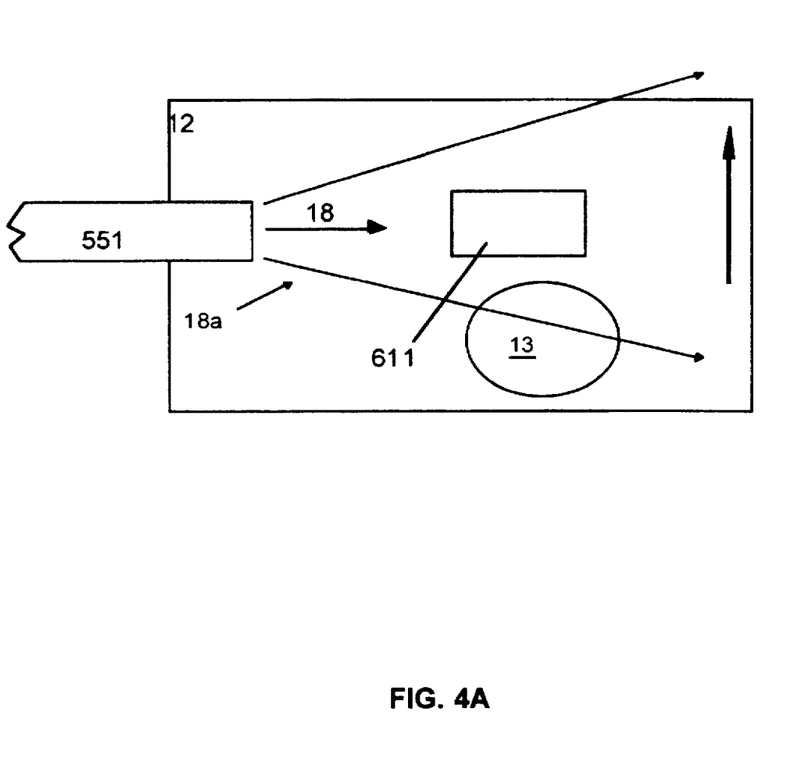
FIGS. 4A and 4B are schematic diagrams illustrating the location of the gas nozzle in one of the examples.
Figure 4B:
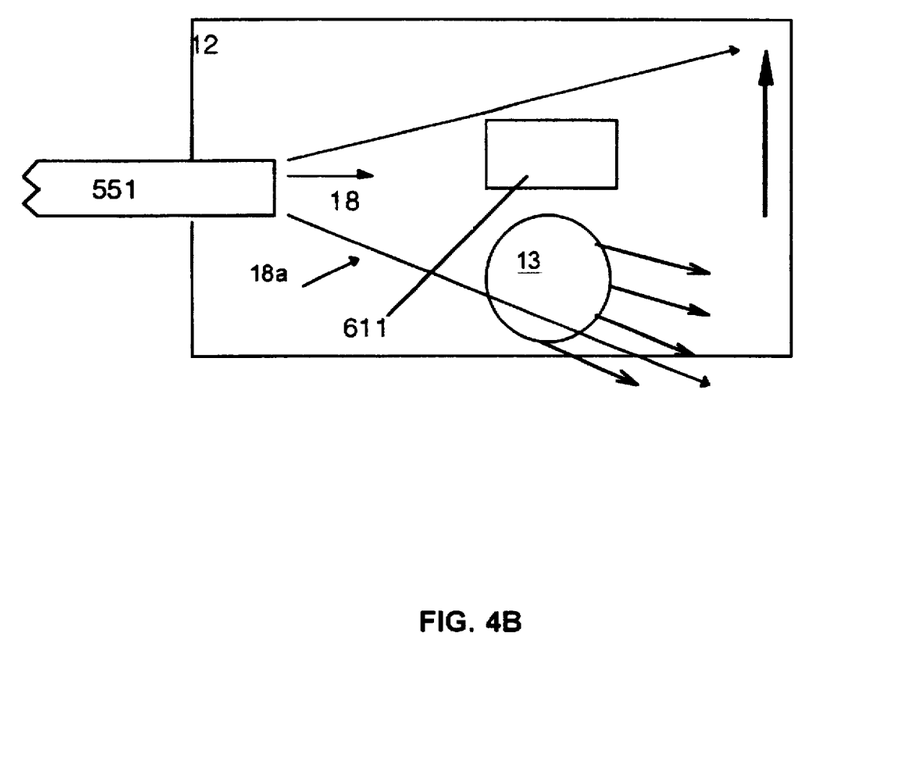

This example utilized 100 mm wafers that were packaged in a 5% buffing solution in a 150 mm wafer carrier. The wafers were patterned to the M1 (Metal 1) layer. An aluminum oxide slurry had been used to planarize the surface. The wafer samples were both unbuffed and buffed (the buffed samples having less slurry residue on the surface), however no difference in removal efficiency was seen between buffed and unbuffed samples. The wafers were still wet when subjected to the process of the invention. Initially, although the slurry was removed, water streaks remained on the wafer surface after treatment using the configuration illustrated in FIG. 4A, which shows a gas flow expansion zone 18a centered on the radiation region 611. It was found that by slightly modifying the direction of the flow of gas 18 the water streaks were completely removed. As is illustrated in FIG. 4B, gas nozzle 551 is directed slightly ahead of the radiation region 611 so that the flow of gas 18 in the gas flow expansion zone 18a removes the moisture 13 remaining on the wafer prior to the time when the wafer is subjected to the combination of radiation and flowing gas. Using this configuration, the flow of nitrogen at 44 l/min functioned not only to minimize the re-entrainment of particles but additionally aided in the removal of water streaks created by the wet chemical baths which are part of the CMP process.

Runs 1–4 were performed with the radiation directed to the surface at an angle of incidence (AI) of 83.90°. Runs 1 and 2 both resulted in damage to the substrate. Run 2 had better removal than Run 1, probably because it was performed at higher energy and power fluxes. Element 459 was utilized in Runs 3 and 4. (See FIG. 2) In Run 3 a 50% beam splitter was employed and damage occurred without removing the slurry residue. Run 4 used a polarizer and had a poor result similar to that of Run 3. Run 5 was performed with the radiation directed at angle of 15° with respect to the substrate. While damage was avoided in Run 5 the removal remained poor.

The angle of radiation incidence was then changed to 6°, which gave surprisingly good results. Runs 6 and 7 resulted in excellent removal of the residue without damage to the substrate at energy and power fluxes well below the fluxes in Runs 1–5. Thus, better cleaning occurred at lower energy and power fluxes, which is contrary to the results expected since cleaning efficiency has typically decreased at reduced fluxes. The results of the CMP slurry residue cleaning tests are summarized in Table 3a, below.

TABLE 3a

| Run | Vl | Epm | Eps | Rl | vs | l | w | Feps | Fpps | Fepa | Npa | Fet | Al | Comments |
|---|---|---|---|---|---|---|---|---|---|---|---|---|---|---|
| 1 | 18.3 | 400 | 238 | 30 | 12 | 35 | 1.8 | 0.53 | 15.5 | 2.38 | 1 | 2.38 | 83.9 | Damage, No removal |
| 2 | 19.7 | 500 | 291 | 30 | 10 | 35 | 1.8 | 0.65 | 19.0 | 3.50 | 1 | 3.50 | 83.9 | Damage, Good removal |
| 3 | 22 | 600 | 170 | 30 | 5 | 35 | 1.8 | 0.38 | 11.1 | 4.07 | 1 | 4.07 | 83.9 | Damage, No removal (beam splitter) |
| 4 | 20.3 | 500 | 127 | 30 | 5 | 35 | 2.8 | 0.13 | 3.82 | 2.18 | 1 | 2.18 | 83.9 | Damage, No removal (polarizer) |
| 5 | 18 | 400 | 278 | 30 | 5 | 35 | 6.7 | 0.12 | 3.49 | 4.77 | 1 | 4.11 | 15 | No Damage, poor removal |
| 6 | 18.8 | 500 | 358 | 30 | 5 | 35 | 14 | 0.07 | 2.15 | 6.13 | 1 | 6.13 | 6 | No Damage, excellent removal |
| 7 | 20.8 | 640 | 451 | 30 | 8 | 35 | 14 | 0.09 | 2.71 | 4.84 | 1 | 4.84 | 6 | No Damage, excellent removal | b. Silicon Nitride Particles

In this example, silicon nitride particles in an aqueous suspension were deposited on bare silicon and allowed to dry. This presented a strongly adhered and very dense contaminant (greater than 10,000 particles on a 150 mm wafer). The flowing gas in this example was argon for Run 1 and nitrogen for Runs 2–17. The gas was delivered at approximately 44 l/min. The quantity of contaminant on the substrate before and after treatment was measured by a Particle Measurements Systems (PMS) silicon wafer particle counter Model 3600 XP. This particle counter employs two HeNe lasers: one operating in p-polarization and the other in s-polarization with its incident beam at angle of 30° to the wafer plane. The collection optics for the particle counter are arranged normal to the wafer plane. Thus, the number of contaminant particles on the substrate in a number of size ranges can be compared before and after treatment.

The efficacy of the treatment can be evaluated by calculating a "percentage removal" or "PR," which is calculated as:

$$PR\ (\%) = (\text{particles removed/particles pre-processing}) \times (100)$$

calculated for three aggregate particle size ranges: 0.1–0.3, 0.4–10, and 0.1–10 µm.

In Runs 1–2 the radiation was directed to the surface at an angle of incidence of 83.9°. Runs 1 and 2 utilized non-polarized light and a polarizer was employed in Runs 3 and 4 as element 459. The remaining runs were performed using non-polarized light and were directed at incident angles of 6.50 (Runs 5–10) and 10° (Runs 11–17). The average removal over the full range of particle sizes (0.1–10 µm) was 66.1% for the 83.90 incident angle as compared to 80.8% and 72.9% particle removal for angles of incidence of 10° and 6.5°, respectively. Thus, the 10° angle of incidence appears to be most effective. The same relative efficacy is observed for the 0.1–0.3 and 0.4–10 µm particle size ranges, although the effect is more pronounced for the larger particle sizes.

The results of the silicon nitride particle removal tests are summarized in Table 3b1, below.

TABLE 3b1

| Run | VI | Epm | Eps | RI | vs | I | w | Feps | Fpps | Fepa | Npa | Fet | Al | PR (.1–.3 µm) | PR (.4–10 µm) | PR (.1–10 µm) |
|---|---|---|---|---|---|---|---|---|---|---|---|---|---|---|---|---|
| 1 | 20.6 | 600 | 222 | 30 | 12 | 35 | 1.9 | 0.33 | 9.84 | 1.59 | 7 | 11.12 | 84 | 91.0 | 83.8 | 88.4 |
| 2 | 20.5 | 600 | 223 | 30 | 4 | 35 | 3.2 | 0.20 | 5.85 | 4.77 | 6 | 28.64 | 84 | 33.6 | −23.7 | 28.5 |
| 3 | 20.4 | 600 |  | 30 | 4 | 35 | 3.2 |  |  |  | 10 |  | 84 | 69.2 | 16.3 | 64.6 |
| 4 | 21.3 | 600 |  | 30 | 1 | 35 | 2.1 |  |  |  | 3 |  | 84 | 85.3 | 71.2 | 82.9 |
| Average for Al = 83.9° |  |  |  |  |  |  |  |  |  |  |  |  |  | 69.8 | 36.9 | 66.1 |
| 5 | 1.92 | 400 | 205 | 30 | 4 | 35 | 2.1 | 0.28 | 8.22 | 4.40 | 2 | 8.80 | 6.5 | 75.2 | 68.1 | 74.5 |
| 6 | 19.5 | 400 | 205 | 30 | 4 | 35 | 2.1 | 0.28 | 8.20 | 4.39 | 3 | 13.17 | 6.5 | 79.4 | 75.3 | 79.0 |
| 7 | 20.0 | 400 | 204 | 30 | 8 | 35 | 2.1 | 0.28 | 8.17 | 2.19 | 2 | 4.38 | 6.5 | 80.2 | 73.0 | 79.6 |
| 8 | 20.5 | 550 | 280 | 30 | 8 | 35 | 4.6 | 0.17 | 5.11 | 3.00 | 2 | 6.00 | 6.5 | 69.8 | 4.3 | 65.8 |
| 9 | 20.5 | 550 | 280 | 30 | 8 | 35 | 4.6 | 0.17 | 5.11 | 3.00 | 2 | 6.00 | 6.5 | 71.9 | 21.9 | 68.4 |
| 10 | 19.0 | 450 | 231 | 30 | 8 | 35 | 4.6 | 0.14 | 4.23 | 2.48 | 3 | 7.44 | 6.5 | 73.9 | 15.1 | 70.0 |
| Average or Al = 6.5° |  |  |  |  |  |  |  |  |  |  |  |  |  | 75.1 | 42.9 | 72.9 |
| 11 | 20.9 | 550 | 271 | 30 | 8 | 35 | 2.6 | 0.30 | 8.75 | 2.90 | 5 | 14.50 | 10 | 85.7 | 94.3 | 86.4 |
| 12 | 20.7 | 550 | 271 | 30 | 8 | 35 | 2.6 | 0.30 | 8.76 | 2.90 | 2 | 5.81 | 10 | 68.0 | 49.3 | 69.4 |
| 13 | 20.7 | 550 | 271 | 30 | 4 | 35 | 2.8 | 0.28 | 8.13 | 5.81 | 2 | 11.61 | 10 | 79.3 | 91.7 | 79.6 |
| 14 | 21.0 | 550 | 271 | 30 | 8 | 35 | 2.8 | 0.28 | 8.12 | 2.90 | 3 | 8.69 | 10 | 78.8 | 86.4 | 79.8 |
| 15 | 21.3 | 550 | 270 | 30 | 8 | 35 | 2.8 | 0.28 | 8.11 | 2.89 | 6 | 17.36 | 10 | 86.4 | 89.7 | 86.7 |
| 16 | 18.8 | 450 | 224 | 30 | 4 | 35 | 2.8 | 0.23 | 6.72 | 4.80 | 2 | 9.80 | 10 | 72.4 | 85.5 | 74.1 |
| 17 | 19.2 | 450 | 223 | 30 | 1 | 35 | 2.8 | 0.23 | 6.71 | 1.92 | 5 | 95.78 | 10 | 70.5 | 90.9 | 73.8 |
| Average or Al = 10° |  |  |  |  |  |  |  |  |  |  |  |  |  | 77.3 | 84.0 | 78.5 |

Although data were collected for a number of particles size ranges (all the data being presented below), PR values are Tables 3b2 and 3b3, below, set forth the detailed particle analysis providing "pre-" and "post-" processing particle counts for particles ranging in size from 0.1 to 10 µm.

TABLE 3b2

| Run | Pre 0.1 µm | Post 0.1 µm | Pre 0.2 µm | Post 0.2 µm | Pre 0.3 µm | Post 0.3 µm | Pre 0.4 µm | Post 0.4 µm | Pre 0.5 µm | Post 0.5 µm | Pre 0.6 µm | Post 0.6 µm | Pre 0.7 µm | Post 0.7 µm |
|---|---|---|---|---|---|---|---|---|---|---|---|---|---|---|
| 1 | 10406 | 949 | 4392 | 147 | 1593 | 375 | 741 | 99 | 373 | 71 | 83 | 19 | 51 | 5 |
| 2 | 1267 | 649 | 543 | 370 | 405 | 452 | 302 | 380 | 160 | 202 | 38 | 42 | 30 | 26 |
| 3 | 9232 | 2036 | 3960 | 1460 | 1328 | 983 | 706 | 639 | 434 | 347 | 89 | 66 | 58 | 42 |
| 4 | 4763 | 778 | 1747 | 133 | 859 | 169 | 537 | 49 | 311 | 45 | 71 | 40 | 45 | 32 |
| 5 | 6656 | 1781 | 4088 | 539 | 1317 | 677 | 609 | 193 | 356 | 101 | 84 | 30 | 68 | 17 |
| 6 | 7083 | 1466 | 3718 | 474 | 1272 | 552 | 518 | 131 | 344 | 59 | 82 | 13 | 55 | 19 |
| 7 | 6399 | 1194 | 2520 | 316 | 953 | 442 | 483 | 127 | 398 | 88 | 71 | 13 | 29 | 8 |
| 8 | 5912 | 1327 | 2249 | 783 | 697 | 563 | 329 | 296 | 156 | 188 | 43 | 51 | 27 | 11 |
| 9 | 5682 | 1169 | 2153 | 732 | 675 | 487 | 293 | 252 | 234 | 193 | 41 | 36 | 30 | 7 |
| 10 | 4888 | 893 | 1760 | 601 | 568 | 388 | 261 | 231 | 164 | 143 | 40 | 33 | 17 | 9 |
| 11 | 4492 | 726 | 1854 | 132 | 558 | 126 | 282 | 22 | 171 | 6 | 33 | 1 | 20 | 0 |
| 12 | 3131 | 1244 | 1254 | 95 | 432 | 203 | 279 | 203 | 149 | 22 | 21 | 6 | 3 | 1 |
| 13 | 2923 | 641 | 1080 | 102 | 448 | 180 | 282 | 27 | 150 | 11 | 26 | 2 | 11 | 0 |

TABLE 3b2-continued

| Run | Pre 0.1 μm | Post 0.1 μm | Pre 0.2 μm | Post 0.2 μm | Pre 0.3 μm | Post 0.3 μm | Pre 0.4 μm | Post 0.4 μm | Pre 0.5 μm | Post 0.5 μm | Pre 0.6 μm | Post 0.6 μm | Pre 0.7 μm | Post 0.7 μm |
|---|---|---|---|---|---|---|---|---|---|---|---|---|---|---|
| 14 | 1948 | 439 | 705 | 53 | 384 | 152 | 256 | 36 | 136 | 17 | 14 | 4 | 18 | 0 |
| 15 | 3440 | 477 | 1327 | 90 | 500 | 147 | 288 | 32 | 123 | 14 | 37 | 3 | 28 | 1 |
| 16 | 1796 | 614 | 941 | 89 | 431 | 172 | 255 | 46 | 148 | 18 | 33 | 4 | 17 | 1 |
| 17 | 1191 | 482 | 713 | 78 | 480 | 143 | 249 | 27 | 133 | 11 | 23 | 3 | 27 | 0 |

TABLE 3b3

| | Pre 1.0 μm | Post 1.0 μm | Pre 1.5 μm | Post 1.5 μm | Pre 2.0 μm | Post 2.0 μm | Pre 3.0 μm | Post 3.0 μm | Pre 4.0 μm | Post 4.0 μm | Pre 5.0 μm | Post 5.0 μm | Pre 7.0 μm | Post 7.0 μm | Pre 10 μm | Post 10 μm |
|---|---|---|---|---|---|---|---|---|---|---|---|---|---|---|---|---|
| 1 | 43 | 6 | 8 | 5 | 5 | 4 | 2 | 0 | 1 | 2 | 1 | 0 | 0 | 0 | 1 | 0 |
| 2 | 9 | 12 | 3 | 6 | 4 | 5 | 0 | 1 | 2 | 3 | 0 | 1 | 0 | 0 | 0 | 0 |
| 3 | 29 | 19 | 12 | 9 | 13 | 1 | 5 | 1 | 0 | 2 | 0 | 0 | 0 | 0 | 0 | 0 |
| 4 | 17 | 52 | 8 | 31 | 10 | 13 | 4 | 6 | 0 | 9 | 0 | 4 | 0 | 2 | 0 | 6 |
| 5 | 38 | 16 | 15 | 4 | 12 | 5 | 3 | 2 | 2 | 3 | 0 | 7 | 1 | 1 | 0 | 0 |
| 6 | 43 | 12 | 11 | 10 | 7 | 8 | 2 | 2 | 2 | 2 | 2 | 4 | 1 | 1 | 0 | 3 |
| 7 | 13 | 3 | 3 | 2 | 1 | 2 | 1 | 0 | 0 | 0 | 1 | 0 | 1 | 0 | 0 | 0 |
| 8 | 17 | 3 | 2 | 1 | 2 | 1 | 2 | 0 | 0 | 0 | 0 | 2 | 0 | 0 | 0 | 0 |
| 9 | 15 | 3 | 9 | 3 | 10 | 2 | 2 | 2 | 3 | 1 | 4 | 4 | 3 | 0 | 0 | 0 |
| 10 | 15 | 7 | 4 | 5 | 5 | 4 | 3 | 1 | 7 | 3 | 2 | 3 | 4 | 3 | 0 | 1 |
| 11 | 11 | 0 | 6 | 1 | 1 | 0 | 0 | 0 | 0 | 0 | 0 | 0 | 0 | 0 | 2 | 0 |
| 12 | 3 | 0 | 1 | 0 | 2 | 0 | 0 | 0 | 0 | 0 | 0 | 0 | 0 | 0 | 0 | 0 |
| 13 | 4 | 0 | 3 | 0 | 3 | 0 | 1 | 0 | 1 | 0 | 0 | 0 | 0 | 0 | 1 | 0 |
| 14 | 11 | 2 | 2 | 1 | 4 | 0 | 0 | 0 | 0 | 0 | 0 | 0 | 1 | 0 | 0 | 0 |
| 15 | 8 | 0 | 2 | 0 | 1 | 0 | 1 | 0 | 0 | 0 | 1 | 0 | 0 | 0 | 4 | 1 |
| 16 | 8 | 0 | 4 | 0 | 2 | 0 | 2 | 0 | 0 | 0 | 2 | 0 | 1 | 0 | 5 | 0 |
| 17 | 11 | 0 | 6 | 0 | 1 | 0 | 0 | 0 | 0 | 0 | 0 | 0 | 0 | 1 | 0 | | c. Polyurethane Foam Removed from Vinyl

In this example, polyurethane foam was removed from acrylonitrile-butadiene-styrene terpolymer vinyl upholstery. At approximately normal incidence, 83.9°, the polyurethane foam appeared to melt into the vinyl upholstery in Runs 6 and 7. In contrast, the foam was cleanly removed at a 6° angle of incidence in Runs 1–5. The number of passes, $N_{pa}$, was dependent on the thickness of the foam attached to the vinyl surface. These results were accomplished at similar fluxes per pass ($F_{epa}$) and somewhat lower fluxes per pulse ($F_{eps}$ and $F_{pps}$). The results of this example are illustrated in Table 3c, below.

Runs 1–17 were performed at 83.9°, while Runs 18–21 employed a 7° angle of incidence. Runs 19–21 utilized a polarizer as element 459. (See FIG. 2) The energy and power flux range for the approximately normal incidence runs is 0.04–0.07 J/cm$^2$ and 1.2–2.0 MW/cm$^2$, respectively. Of these runs more than half were either ineffective or caused damage to the substrate. In contrast, the "oblique angle" runs had a much greater flux range yet every run was effective and did not damage the substrate material. These results demonstrate that at a non-normal angle of incidence the operating window is significantly larger for particle removal TABLE 3c

| Run | VI | Epm | Eps | RI | vs | I | w | Feps | Fpps | Fepa | Npa | Fet | AI | Comments |
|---|---|---|---|---|---|---|---|---|---|---|---|---|---|---|
| 1 | 20.1 | 500 | 294 | 30 | 4 | 28 | 18.4 | 0.057 | 1.68 | 7.9 | 1 | 7.9 | 6 | Foam removed |
| 2 | 20 | 500 | 294 | 30 | 3 | 28 | 18.4 | 0.057 | 1.68 | 10.5 | 3 | 31.6 | 6 | Foam removed |
| 3 | 20 | 500 | 294 | 30 | 3 | 28 | 18.4 | 0.057 | 1.68 | 10.5 | 8 | 84.1 | 6 | Foam removed |
| 4 | 20.5 | 550 | 322 | 30 | 3 | 28 | 18.4 | 0.063 | 1.84 | 11.5 | 3 | 34.5 | 6 | Best removal |
| 5 | 20 | 500 | 294 | 30 | 3 | 28 | 18.4 | 0.057 | 1.68 | 10.5 | 8 | 84.1 | 6 | Poor removal (polarizer) |
| 6 | 204 | 500 | 238 | 30 | 3 | 28 | 8.6 | 0.099 | 2.91 | 8.5 | 5 | 42.5 | 83.9 | Damaged, Not cleaned |
| 7 | 20.5 | 550 | 261 | 30 | 3 | 28 | 8.6 | 0.109 | 3.19 | 9.3 | 1 | 9.3 | 83.9 | Damaged, Not cleaned | d. Particles on a Thin Film of Chrome on a Quartz Photomask

In this example, particles were removed from a photomask formed of quartz coated with a thin layer of chrome.

of this type. The results of this example are illustrated in Table 3d, below.

TABLE 3d

| Run | VI | Epm | Eps | RI | vs | I | w | Feps | Fpps | Fepa | Npa | Fet | Al | Comments |
|---|---|---|---|---|---|---|---|---|---|---|---|---|---|---|
| 1 | 19 | 504 | 55 | 30 | 5 | 27 | 5.0 | 0.04 | 1.2 | 1.2 | 1 | 1.2 | 83.9 | little removal |
| 2 | 19 | 510 | 55 | 30 | 3 | 27 | 5.0 | 0.04 | 1.2 | 2.1 | 1 | 2.1 | 83.9 | no removal |
| 3 | 21 | 597 | 63 | 30 | 3 | 27 | 5.0 | 0.05 | 1.4 | 2.3 | 1 | 2.3 | 83.9 | little removal |
| 4 | 21 | 597 | 63 | 30 | 3 | 27 | 4.0 | 0.06 | 1.7 | 2.3 | 1 | 2.3 | 83.9 | good removal |
| 5 | 21 | 590 | 62 | 30 | 3 | 27 | 4.0 | 0.06 | 1.7 | 2.3 | 1 | 2.3 | 83.9 | remove particles, some haze |
| 6 | 22 | 656 | 67 | 30 | 3 | 27 | 4.0 | 0.06 | 1.8 | 2.5 | 1 | 2.5 | 83.9 | no apparent particle removal |
| 7 | 22 | 653 | 67 | 30 | 3 | 27 | 4.0 | 0.06 | 1.8 | 2.5 | 1 | 2.5 | 83.9 | good removal, some cracks in Cr |
| 8 | 22 | 657 | 67 | 30 | 3 | 27 | 4.0 | 0.06 | 1.8 | 2.5 | 1 | 2.5 | 83.9 | good removal |
| 9 | 22 | 657 | 67 | 30 | 5 | 27 | 4.0 | 0.06 | 1.8 | 1.5 | 1 | 1.5 | 83.9 | good removal |
| 10 | 22 | 657 | 67 | 39 | 3 | 27 | 4.0 | 0.06 | 1.8 | 2.5 | 2 | 5.0 | 83.9 | good removal, no change 2nd pass |
| 11 | 22 | 656 | 67 | 30 | 3 | 27 | 3.8 | 0.07 | 2.0 | 2.5 | 1 | 2.5 | 83.9 | some damage |
| 12 | 20 | 653 | 60 | 30 | 3 | 27 | 3.8 | 0.06 | 1.7 | 2.2 | 1 | 2.2 | 83.9 | no damage |
| 13 | 18 | 408 | 45 | 30 | 3 | 27 | 3.8 | 0.04 | 1.3 | 1.7 | 1 | 1.7 | 83.9 | no damage |
| 14 | 21 | 623 | 65 | 30 | 3 | 27 | 3.8 | 0.06 | 1.9 | 2.4 | 1 | 2.4 | 83.9 | no damage |
| 15 | 22 | 653 | 67 | 30 | 3 | 27 | 3.8 | 0.07 | 1.9 | 2.5 | 1 | 2.5 | 83.9 | removal |
| 16 | 20 | 560 | 60 | 30 | 3 | 27 | 3.8 | 0.06 | 1.7 | 2.2 | 1 | 2.2 | 83.9 | removal |
| 17 | 18 | 427 | 48 | 30 | 3 | 27 | 3.8 | 0.05 | 1.4 | 1.8 | 1 | 1.8 | 83.9 | no removal |
| 18 | 19 | 400 | 20 | 30 | 10 | 29 | 12 | 0.01 | 0.2 | 0.2 | 1 | 0.2 | 7 | excellent removal |
| 19 | 20 | 450 | 130 | 30 | 10 | 29 | 7.3 | 0.06 | 1.8 | 1.3 | 1 | 1.3 | 7 | excellent removal (polarizer, s-mode) |
| 20 | 20 | 450 | 130 | 30 | 10 | 29 | 7.3 | 0.06 | 1.8 | 1.3 | 1 | 1.3 | 7 | excellent removal (polarizer, p-mode) |
| 21 | 21 | 550 | 160 | 30 | 10 | 29 | 7.3 | 0.08 | 22 | 1.7 | 1 | 1.7 | 7 | excellent removal (polarizer, s-mode) |

4. Examples of Removal of Material Using Before and Through Focus Incidence

Figure 5A:
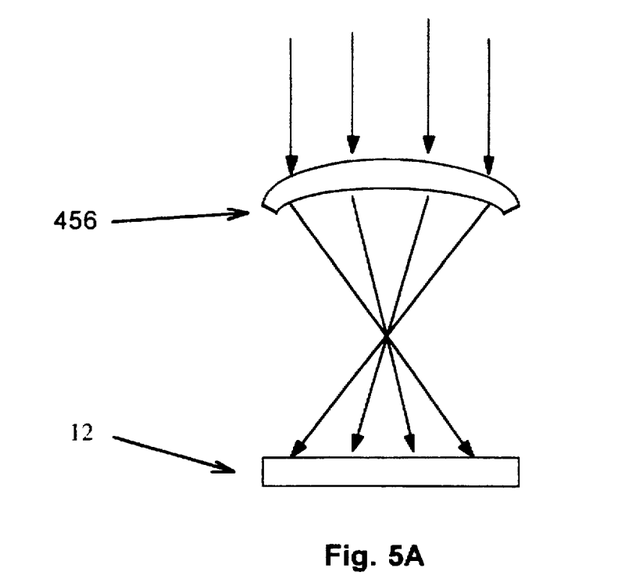
FIGS. 5A and 5B are schematic diagrams illustrating the disposition of the focal plane of the radiation beam.
Figure 5B:
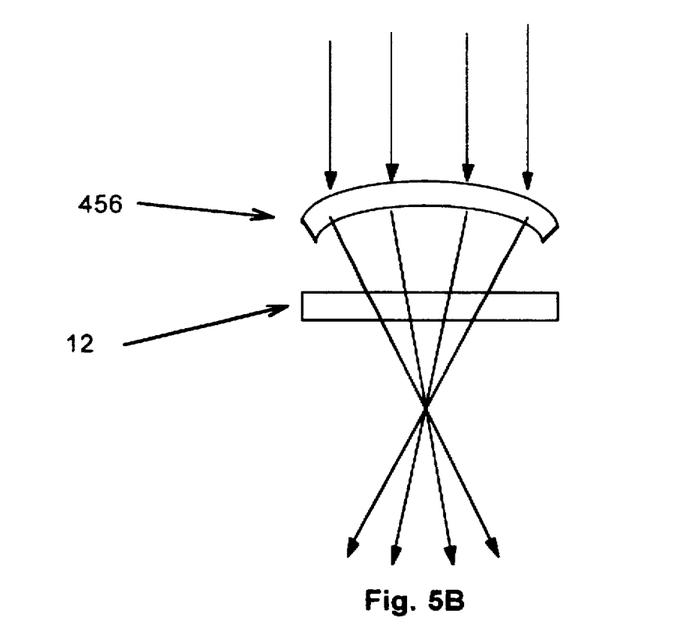

As described above, the focal plane of the cylindrical lens 456 can be focused before or through the plane of the substrate surface being treated. Before and through focus are illustrated in FIGS. 5A and 5B, respectively.

The following examples gave mixed results. Some of the examples showed a preference for before focus while others demonstrated better removal and less damage employing the through focus method. It is believed that the location of the focal plane represents another of the various process variables—identified by the inventors—which effect the competing goals of the invention: removal efficiency and damage avoidance. All runs utilized nitrogen as the flowing gas which was introduced at 44 l/min.

a. X-Ray Lithography Masks

In this example, particles were removed from a quartz photomask having a thin gold layer. Good removal occurred in Runs 1–8 and 11–16 using through focus and a p-mode polarizer 459. On the other hand, damage resulted from the employment of before focus without a polarizer in Runs 17–21. The results of this example are illustrated in Table 4a, below.

TABLE 4a

| Run | VI | Epm | Eps | RI | vs | I | w | Feps | Fpps | Feea | Npa | Fet | Al | Comments |
|---|---|---|---|---|---|---|---|---|---|---|---|---|---|---|
| 1 | 21.6 | 500 | 150 | 30 | 15 | 36 | 15.5 | 0.03 | 0.77 | 0.81 | 1 | 0.81 | 5.8 | good removal, no damage (polarizer p-mode & beam splitter) |
| 2 | 20.7 | 500 | 150 | 30 | 15 | 36 | 15.5 | 0.03 | 0.77 | 0.81 | 1 | 0.81 | 5.8 | good removal, no damage (polarizer p-mode & beam splitter) |
| 3 | 20.5 | 500 | 160 | 20 | 15 | 36 | 15.5 | 0.03 | 0.77 | 0.81 | 1 | 0.81 | 5.8 | good removal, no damage (polarizer p-mode & beam splitter) |
| 4 | 20.3 | 500 | 150 | 30 | 15 | 36 | 15.5 | 0.03 | 0.77 | 0.81 | 1 | 0.81 | 5.8 | good removal, no damage (polarizer p-mode & beam splItter) |
| 5 | 20.9 | 500 | 150 | 30 | 15 | 36 | 14 | 0.03 | 0.85 | 0.81 | 1 | 0.81 | 5.8 | good removal, no damage (polarizer p-mode & beam splitter) |
| 6 | 18.1 | 350 | 100 | 20 | 15 | 36 | 14 | 0.02 | 0.60 | 0.57 | 1 | 0.57 | 5.8 | good removal, no damage (polarizer p-mode & beam splitter) |
| 7 | 20.9 | 500 | 150 | 30 | 15 | 36 | 17 | 0.02 | 0.70 | 0.81 | 1 | 0.81 | 5.8 | good removal, no damage (polarizer p-mode & beam splitter) |
| 8 | 20.1 | 600 | 60 | 30 | 15 | 27 | 13 | 0.02 | 0.52 | 0.46 | 1 | 0.46 | 6.1 | good removal, no damage (polarizer p mode & beam splitter) |
| 9 | 20.1 | 500 | 60 | 20 | 15 | 13 | 28 | 0.02 | 0.49 | 0.94 | 1 | 0.94 | 6.1 | damage (polarizer p-mode) |
| 10 | 19.9 | 500 | 60 | 15 | 15 | 13 | 28 | 0.02 | 0.50 | 0.47 | 1 | 0.47 | 6.1 | damage (polarizer p-mode) |
| 11 | 20.0 | 500 | 40 | 30 | 15 | 13 | 28 | 0.01 | 0.32 | 0.60 | 1 | 0.60 | 6.1 | good removal, no damage (polarizer p-mode & beam splitter) |
| 12 | 19.9 | 500 | 40 | 30 | 15 | 13 | 28 | 0.01 | 0.32 | 0.60 | 1 | 0.60 | 6.1 | good removal, no damage (polarizer p-mode & beam splitter) |
| 13 | 20.1 | 500 | 30 | 30 | 15 | 13 | 28 | 0.01 | 0.27 | 0.51 | 1 | 0.51 | 6.1 | good removal, no damage (double polarizer p-mode) |
| 14 | 20.3 | 500 | 40 | 30 | 15 | 13 | 28 | 0.01 | 0.32 | 0.60 | 4 | 2.41 | 6.1 | good removal, no damage (polarizer p-mode & beam splitter) |

TABLE 4a-continued

| Run | VI | Epm | Eps | RI | vs | I | w | Feps | Fpps | Feea | Npa | Fet | Al | Comments |
|---|---|---|---|---|---|---|---|---|---|---|---|---|---|---|
| 15 | 22.0 | 620 | 50 | 20 | 15 | 13 | 28 | 0.01 | 0.38 | 0.73 | 1 | 0.73 | 6.1 | good removal, no damage (polarizer p-mode & beam splitter) |
| 16 | 22.0 | 620 | 40 | 30 | 15 | 13 | 28 | 0.01 | 0.32 | 0.61 | 1 | 0.61 | 6.1 | good removal, no damage (double polarizer p-mode) |
| 17 | 17.1 | 300 | 100 | 30 | 15 | 30 | 14 | 0.02 | 0.68 | 0.65 | 1 | 0.65 | 5.8 | damage |
| 18 | 17.6 | 360 | 110 | 30 | 15 | 30 | 14 | 0.03 | 0.80 | 0.76 | 1 | 0.76 | 5.8 | damage |
| 19 | 18.2 | 400 | 130 | 30 | 15 | 30 | 14 | 0.03 | 0.91 | 0.87 | 1 | 0.87 | 5.8 | damage |
| 20 | 18.8 | 450 | 150 | 30 | 15 | 30 | 14 | 0.03 | 1.02 | 0.97 | 1 | 0.97 | 5.8 | damage |
| 21 | 19.6 | 500 | 160 | 30 | 15 | 30 | 14 | 0.04 | 1.13 | 1.08 | 1 | 1.08 | 5.8 | damage | b. Quartz Photomasks

In this example, particles were removed from a quartz photomask having a thin chrome layer. Good removal occurred in Runs 2 and 3 using before focus and damage resulted in Run 1 where through focus was utilized. The results of this example are illustrated in Table 4b, below.

TABLE 4b

| Run | VI | Epm | Eps | RI | vs | I | w | Feps | Fpps | Feea | Npa | Fet | Al | Comments |
|---|---|---|---|---|---|---|---|---|---|---|---|---|---|---|
| 1 | | 500 | 66 | 30 | 10 | 26 | 9.4 | 0.025 | 0.735 | 0.71 | 1 | 0.71 | 6.1 | damage (polarizer s-mode) |
| 2 | | 500 | 66 | 20 | 10 | 28 | 9.4 | 0.025 | 0.735 | 0.71 | 1 | 0.71 | 6.1 | good removal, no damage (polarizer s-mode) |
| 3 | | 550 | 71 | 30 | 20 | 10 | 9.4 | 0.027 | 0.794 | 0.038 | 1 | 0.038 | 6.1 | good removal, no damage (polarizer s-mode) |

What is claimed is:

1. A method for removing undesired material from a treatment surface of a substrate without affecting the physical properties of desired material to be left on the treatment surface adjacent to or underlying the undesired material, comprising the steps of:
    selecting a substrate and an undesired material to be removed from the treatment surface of the substrate that cannot be removed by radiation of the treatment surface by photons applied at a first incident angle approximately normal to the treatment surface in a predetermined spatial and temporal concentration insufficient to alter the physical properties of the desired material;
    irradiating the treatment surface with photons at a second incident angle substantially less than said first incident angle in said predetermined spatial and temporal concentration to release the undesired material from the treatment surface; and
    simultaneously introducing across said undesired material a flow of gas substantially inert to said substrate.

2. The method of claim 1 wherein said second incident angle is less than approximately 20°.

3. The method of claim 2 wherein said second incident angle is less than approximately 10°.

4. The method of claim 1 wherein said desired material is silicon.

5. The method of claim 4 wherein said undesired material is selected from the group consisting of aluminum oxide and silicon nitride.

6. The method of claim 1 wherein said desired material is chrome.

7. The method of claim 1 wherein said desired material is acrylonitrile-butadiene styrene terpolymer and said undesired material is polyurethane.

8. The method of claim 1 wherein said photons have an energy of approximately 5 eV/photon.

9. The method of claim 8 wherein said photons are generated by a pulsed KrF excimer laser.

10. The method of claim 1 wherein said second incident angle is approximately 15° or less.

11. The method of claim 1 wherein said second incident angle is approximately 6°.

12. The method of claim 5 wherein said second incident angle is approximately 10° or less.

13. The method of claim 5 wherein said second incident angle is approximately 6°.

14. The method of claim 5 wherein said second incident angle is approximately 6.5°.

15. The method of claim 6 wherein said second incident angle is approximately 7°.

16. The method of claim 7 wherein said second incident angle is approximately 6°.

17. A method for removing undesired material from a treatment surface of a substrate without affecting the physical properties of desired material to be left on the treatment surface adjacent to or underlying the undesired material, comprising the steps of:
    selecting a substrate and an undesired material to be removed from the treatment surface of the substrate that cannot be removed by irradiation of the treatment surface by photons applied at a first incident angle approximately normal to the treatment surface in a predetermined spatial and temporal concentration insufficient to alter the physical properties of the desired material;
    selecting a second incident angle, substantially less than said first incident angle, at which irradiation of the treatment surface with photons at said predetermined spatial and temporal concentration is sufficient to release the undesired material from the treatment surface;
    irradiating the treatment surface with photons at said second incident angle at said predetermined spatial and temporal concentration; and
    simultaneously inducing across said undesired material a flow of gas substantially inert to said substrate.

18. The method of claim 17 wherein said predetermined spatial and temporal concentration is insufficient to raise the temperature of the undesired material above the temperature at which the undesired material melts or thermally decomposes.

19. The method of claim 17 wherein said predetermined spatial and temporal concentration is sufficient to break the constituent bonds of the undesired material and insufficient to raise the temperature of the undesired material to a level which would produce substantial changes in the physical properties of the surface monolayer of the desired material.

20. The method of claim 17 wherein said second incident angle is approximately 15° or less.

21. The method of claim 20 wherein:

said desired material is silicon;

said undesired material is selected from the group consisting of aluminum oxide and silicon nitride; and said second incident angle is approximately 10° or less.

22. The method of claim 17 wherein said photons have an energy of approximately 5 eV/photon.

* * * * *